United States Patent

Donoghue

[15] 3,697,777

[45] Oct. 10, 1972

[54] SIGNAL GENERATING CIRCUIT INCLUDING A PAIR OF CASCADE CONNECTED FIELD EFFECT TRANSISTORS

[72] Inventor: William James Donoghue, Somerset, N.J.

[73] Assignee: RCA Corporation

[22] Filed: May 17, 1971

[21] Appl. No.: 143,859

[52] U.S. Cl. ..................307/228, 307/251, 307/304, 328/183

[51] Int. Cl. ..............................................H03k 4/08

[58] Field of Search......................307/251, 304, 228; 328/181–185; 330/18, 19, 25, 26, 28, 35

[56] References Cited

UNITED STATES PATENTS

| | | | |
|---|---|---|---|
| 2,998,532 | 8/1961 | Smeltzer | 307/228 |
| 3,286,189 | 11/1966 | Mitchell et al. | 307/251 X |
| 3,302,040 | 1/1967 | Dryden | 307/228 |
| 3,322,969 | 5/1967 | Callahan | 307/228 |
| 3,447,099 | 5/1969 | Lockshaw | 307/228 X |

*Primary Examiner*—Stanley D. Miller, Jr.
*Attorney*—Edward J. Norton

[57] ABSTRACT

A signal generating circuit including a constant current source comprising cascoded field effect transistors. The first transistor is biased into saturation and the second transistor is biased in the linear resistive region of operation. Degenerative feedback is provided between the output of the first transistor and the control electrode of the second transistor. When an energy storage device and a switch are added, the circuit provides a constant amplitude ramp waveform.

6 Claims, 3 Drawing Figures

INVENTOR.
William J. Donoghue
BY
Edward J. Norton
ATTORNEY

INVENTOR.
William J. Donoghue
BY
Edward J. Norton
ATTORNEY

SIGNAL GENERATING CIRCUIT INCLUDING A PAIR OF CASCADE CONNECTED FIELD EFFECT TRANSISTORS

The invention herein described was made in the course of or under a contract or subcontract thereunder with the Department of the Air Force.

This invention relates to a signal generator and more specifically to a signal generator including a constant current source comprising a pair of field effect transistors susceptible of monolithic integration using metal-oxide semiconductor technology.

The invention described herein is especially useful in the implementation of a ramp generator which may be utilized in a phase comparator circuit in applications such as frequency synthesizers or any other application where a phase comparator is desired.

Generally speaking it is known to provide a ramp generator by connecting an energy storage device such as a capacitor to the output of a constant current source with a switching device used to periodically discharge the capacitor.

One problem with the prior art ramp generators is that, to varying degrees, the current from the source is not constant and thus the amplitude of the ramp tends to vary.

Additionally, it has become desirable to provide these ramp generators in integrated form so as to take advantage of the smaller size and weight factors attainable through integrated circuit technology.

Three problems have been noted in prior attempts to utilize integrated circuit technology for providing signal generating circuits.

First, there are mobility variations from chip to chip. In some cases the mobility variation is quite severe, on the order of 3 to 1, which would make many chips in a given production run unsuitable because currents would vary on the order of 3 to 1 for the same applied voltages from chip to chip.

Second, it has been observed that prior art devices are quite temperature sensitive. A change of environmental temperature, on the order of 30° or 40° centigrade, may make the device unsuitable for its designated purpose as a signal generator.

Third, when utilizing insulated gate field effect transistors in metal-oxide semiconductor (MOS) technology the threshold voltages are difficult to control precisely. Variations of threshold voltage from chip to chip may make some chips unsuitable for the application. The threshold voltage for an insulated gate field effect transistor is defined as that gate-to-source voltage required to start the flow of drain current.

The invention described herein demonstrates a technique for implementing a signal generating device, for example a ramp generator, which overcomes the problems of mobility variations and threshold variations from chip to chip and is operable over a wide range of temperatures. Although the invention is especially useful in the area of integrated circuits the concepts and structure disclosed may also be used with discrete devices.

In accordance with the invention, a first and second insulated gate field effect transistor are provided with one main electrode of the first transistor connected to one main electrode of the second transistor. The first transistor is biased into the saturated region of operation, and the second is biased into the linear region of operation. A source of potential is applied to the other main electrode of the second transistor. Means are provided for connecting the other main electrode of the first transistor to the control electrode of the second transistor.

IN THE DRAWING

In the present disclosure the invention is embodied in a ramp generator, however, it will be evident that the invention is not limited to a particular type of waveform generation and is applicable to any signal generating scheme wherein a constant current source is desirable.

Figure 1:
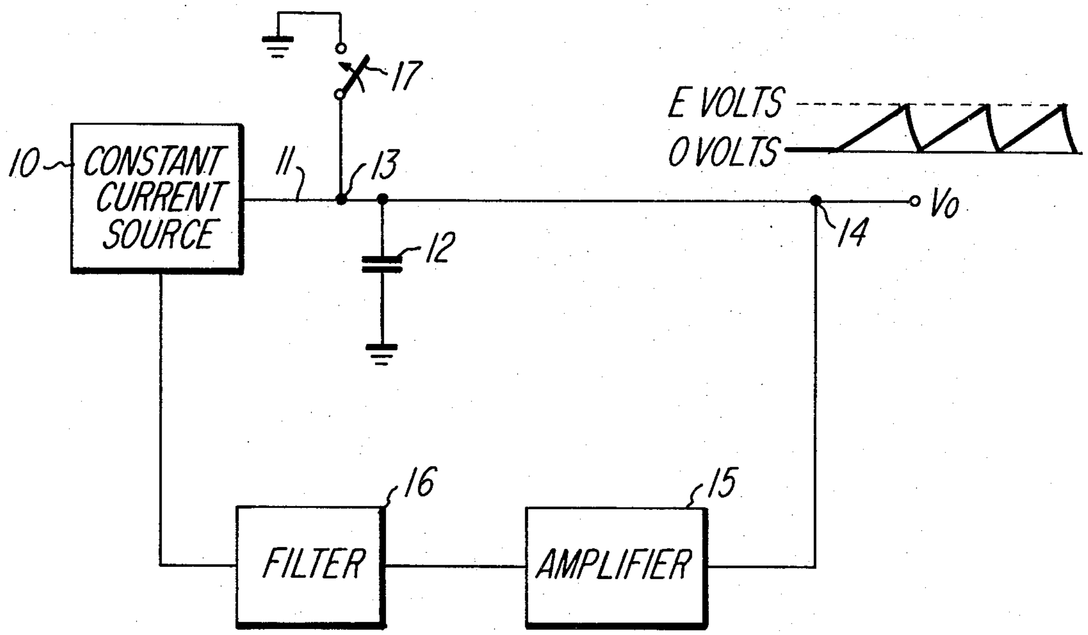
FIG. 1 is a block diagram of a ramp generating circuit.

In FIG. 1, a current source 10 provides a constant current, via line 11, to an energy storage capacitor 12. One terminal of capacitor 12 is connected to a point 13 and the other terminal is connected to ground.

Point 13 is also connected to output terminal 14 where the output signal $V_o$ will appear. A feedback loop is provided between point 14 and source 10 which includes an amplifying stage 15 and a filter stage 16. A switching device 17 is connected between point 13 and ground.

In operation the current source starts to charge capacitor 12 toward some potential determined by the internal supply (not shown) associated with source 10. At a predetermined time, such as the point where capacitor 12 is charged to E volts, the normally open switch 17 is closed and the capacitor discharges through switch 17 to ground causing the output voltage to decay to zero volts at point 14. Switch 17 is then reopened and capacitor 12 again starts to store energy supplied from the constant current source 10. By periodically closing and opening switch 17 a ramp wave form is generated, as shown, at output terminal 14.

The output waveform is shaped and filtered by amplifier 15 and 16, and a control voltage is supplied via this feedback loop to the source 10. If the current from source 10 should increase for any reason then the output signal $V_o$ would reach the desired peak value E in a shorter time span. In other words the amplitude of the ramp would be altered. If, in this situation, switch 17 closes periodically and independent of the peak amplitude of the ramp, then the output signal $V_o$ could go to a value greater than E volts before decaying to zero.

In order to correct for changes in the current supplied to capacitor 12, the feedback control signal is applied to the source 10 such that the control signal tends to lower the current from the source 10 when an increase of current is sensed at point 14. Thus, in general terms, a ramp generator circuit has been described. Prior art implementations of a ramp generator such as that shown in FIG. 1, in integrated circuit form have been subject to the problems previously mentioned.

Figure 2:
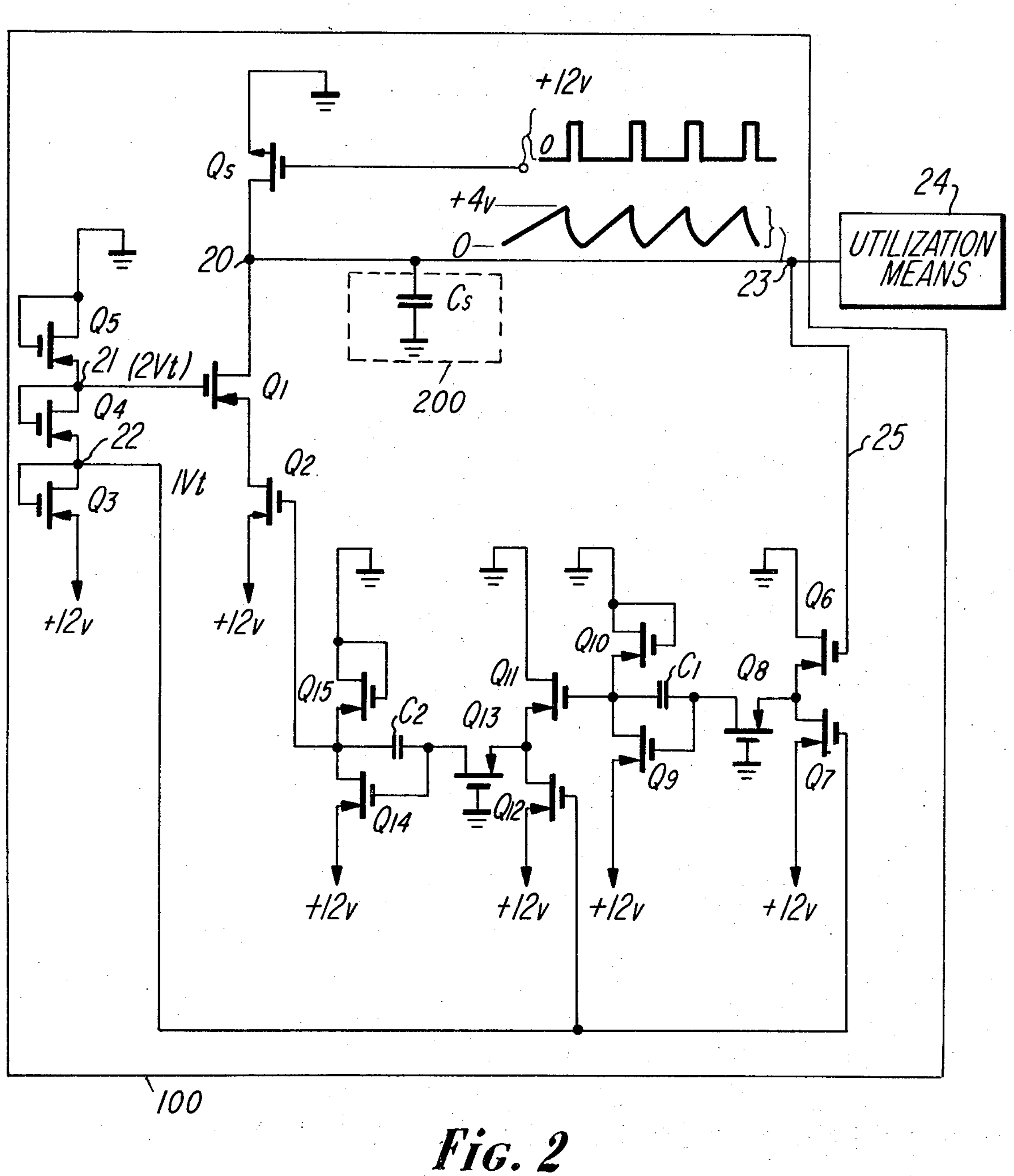
FIG. 2 is a schematic diagram of a ramp generating circuit embodying the present invention.

FIG. 2 shows a ramp generator implementation which overcomes the prior art problems through the use of MOS integrated circuit technology.

All of the transistors shown in FIG. 2 are P channel MOS insulated gate field effect transistors with the exception of transistor $Q_s$ which is an N channel device. All devices shown in FIG. 2 are integrated on the same chip (designated by the solid block 100 in FIG. 2) with the exception of the capacitor $C_s$ (shown within the dashed box 200) which can be a discrete element and externally connected to the chip 100.

Transistor $Q_1$ and $Q_2$ are connected in a cascode arrangement with one main electrode, the source, of transistor $Q_1$ connected to one main electrode, the drain, of transistor $Q_2$. The source electrode of transistor $Q_2$ is connected to a voltage supply of plus 12 volts d.c. and the drain electrode of transistor $Q_1$ is connected to point 20.

Each of transistors $Q_3$, $Q_4$, and $Q_5$ have their gate electrodes connected directly to their respective drain electrodes. In addition, a plus 12 volt supply is connected to the source electrode of transistor $Q_3$. The drain of transistor $Q_3$ is connected to the source electrode of transistor $Q_4$, the drain electrode of transistor $Q_4$ is connected to the source electrode of transistor $Q_5$, and the drain electrode of transistor $Q_5$ is grounded. The arrangement of transistors $Q_3$–$Q_5$ is known in the art and is used to provide biasing for other elements in a fashion which is analogous to a resistive voltage divider network.

In the specific arrangement in FIG. 2 the junction 21 between the drain of transistor $Q_4$ and the source of transistor $Q_5$ provides a voltage of approximately 2 times the threshold voltage of transistor $Q_1$. Point 21 is electrically connected to the gate electrode of transistor $Q_1$. The biasing on the gate of transistor $Q_1$ puts the transistor in the saturated region of operation, as will be discussed more fully herein.

A voltage substantially equal to the threshold voltage is obtained at junction point 22 where the drain of transistor $Q_3$ is connected to the source of transistor $Q_4$.

An energy storage capacitor, $C_s$, is electrically connected between ground and junction point 20. Also, a switching transistor $Q_s$ of the N channel type has its drain connected to point 20 and its source connected to ground. A trigger signal comprising a train of periodic positive going pulses, having an amplitude of plus 12 volts is applied to the control or gate electrode of transistor $Q_s$ from a suitable source, not shown.

The common junction point 20 of the drain of transistor $Q_s$, one terminal of capacitor $C_s$ and the drain of transistor $Q_1$ is electrically connected to an output terminal 23 to which a high input impedance utilization means 24 may be connected. An output signal ramp going from zero to plus four volts is shown in FIG. 2 as the generated output signal.

The signal at output terminal 23 is degeneratively fed back to the gate of transistor $Q_2$ in the following manner. Point 23 is electrically connected to the gate of transistor $Q_6$ via line 25. The drain of transistor $Q_6$ is connected to ground and the source of transistor $Q_6$ is connected to the drain of another transistor $Q_7$. The source electrode of transistor $Q_7$ is connected to a plus 12 volt supply voltage, and the gate electrode of transistor $Q_7$ is electrically connected to junction point 22 such that the threshold voltage developed at point 22 is applied to the gate of transistor $Q_7$. Transistors $Q_6$ and $Q_7$ form a source follower stage in that the voltage at the source of transistor $Q_6$ will follow the voltage applied to the gate of transistor $Q_6$.

Transistor $Q_8$ has its source electrode connected to the junction of the source and drain of transistor $Q_6$ and $Q_7$, respectively, while the gate electrode of transistor $Q_8$ is connected to ground. The arrangement of transistor $Q_8$ provides, in effect a high resistance, on the order of 5 megohms. The drain electrode of transistor $Q_8$ is connected to the gate electrode of transistor $Q_9$ and one terminal of capacitor $C_1$.

The source electrode of transistor $Q_9$ is connected to a plus 12 volt source of voltage, and the drain of transistor $Q_9$ is connected to the source of transistor $Q_{10}$ and to the other terminal of capacitor $C_1$. The gate of transistor $Q_{10}$ is connected to the drain of transistor $Q_{10}$, and the junction point of the gate and drain of transistor $Q_{10}$ is connected to ground.

The arrangement of transistors $Q_{10}$, $Q_9$, capacitor $C_1$ and transistor $Q_8$ provides a low pass filtering function. The arrangement of transistors $Q_{10}$, $Q_9$, capacitor $C_1$, transistor $Q_8$, and transistor $Q_6$ also provides a certain amount of gain. With capacitor $C_1$ designed to be 15pf, the overall gain of the stage is approximately one, and the output signal is a d.c. level at the junction of the source of transistor $Q_{10}$, the drain of transistor $Q_9$ and one terminal of capacitor $C_1$. It should be noted that with capacitor $C_1$ effectively connected between the drain and gate of transistor $Q_9$, the arrangement takes advantage of the Miller effect and the input capacitance as seen by transistor $Q_9$ is effectively greater than the actual 15pf of capacitor $C_1$.

An identical amplifying and filtering stage is connected to the previous amplifying stage, where transistors $Q_{11}$, $Q_{12}$, $Q_{13}$, capacitor $C_2$, transistors $Q_{14}$ and $Q_{15}$ correspond to transistors $Q_6$, $Q_7$, $Q_8$, capacitor $C_1$, transistors $Q_9$ and $Q_{10}$, respectively. In the second stage, however, capacitor $C_2$ is designed to be 25pf and the gain of the stage is approximately five.

The control signal, for transistor $Q_2$, which is a d.c. level is taken from the common point of the source of transistor $Q_{15}$, the drain of transistor $Q_{14}$ and one terminal of capacitor $C_2$, and is coupled to the gate of transistor $Q_2$.

Typically, the control signal may be a plus 7 volt d.c. signal and the threshold voltage for the devices under consideration may be on the order of plus 2 volts. With plus 12 volts on the source electrode of transistor $Q_2$, the source-to-gate voltage is then on the order of plus 5 volts, and the source-to-gate voltage less the threshold voltage, to get transistor $Q_2$ turned on, is approximately 3 volts. Under these conditions, the source-to-drain voltage of transistor $Q_2$ is between 0.5 and 1.0 volts which places transistor $Q_2$ in the linear region of operation, that is, where the gate-to-source voltage less the threshold voltage is much greater than the drain-to-source voltage of the device.

Figure 3:
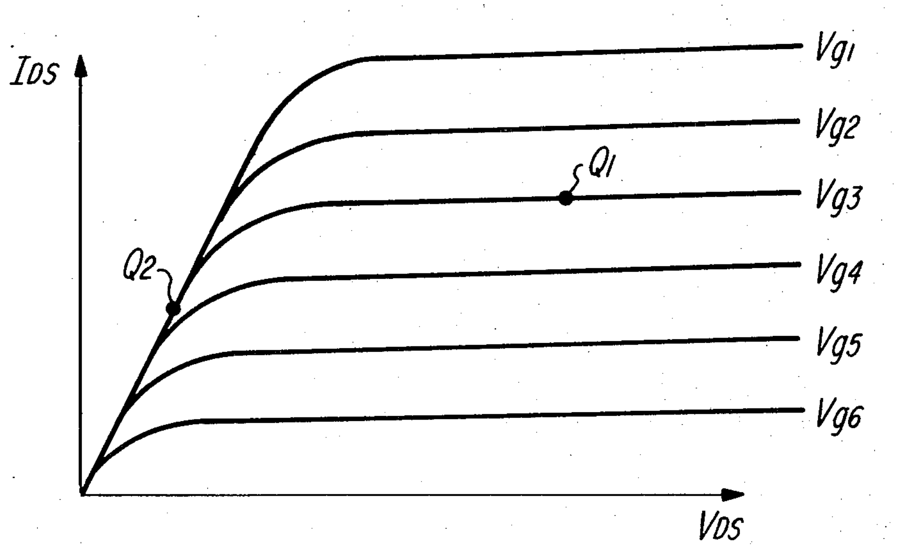
FIG. 3 is a typical family of curves for an insulated gate field effect transistor representing the drain-to-source current versus drain-to-source voltage for various applied gate voltages.

Referring to the family of characteristic curves in FIG. 3, it is seen that transistor $Q_1$ being biased well into the saturated or flat region of operation, that is, beyond the channel pinchoff, has a relatively constant drain-to-source current for a wide variation in drain-to-source voltage. It should be noted that in actual design the channel width of transistor $Q_1$ is made fairly small to insure a flat curve or constant current when operated beyond the knee of the curves, that is, in saturation.

In addition, transistor $Q_2$ is biased into the linear region of operation, that is, before channel pinchoff, on the curve of FIG. 3. The curve shows that, for a particular gate voltage, $V_{gn}$, the drain-to-source current, $I_{ds}$, varies linearly with the drain-to-source voltage, $V_{ds}$, In the particular embodiment under discussion, it is observed that when the gate voltage is increased, from one positive value to another positive value, the drain-to-source current linearly decreases and when the gate voltage decreases, from one positive value to another positive value, the drain-to-source current linearly increases.

The operation of transistor $Q_2$ is in effect that of a variable linear resistive load which is coupled into the source electrode circuit of transistor $Q_1$.

Referring back to FIG. 2 and looking at the combined operation of transistors $Q_1$ and $Q_2$, it will be seen that the biasing applied to the gate of transistor $Q_1$ places transistor $Q_1$ in saturation and a certain current is applied to one terminal of capacitor $C_s$. When a trigger pulse is applied to the gate of transistor $Q_s$, the capacitor $C_s$ discharges to ground through the drain-to-source path of $Q_s$ which also takes the source-to-drain current of transistor $Q_1$. Thus $Q_s$ is made fairly large.

If for any reasons the source-to-drain current of transistor $Q_1$ should increase, for example by way of a temperature change, the feedback loop will present a higher control signal to the gate of transistor $Q_2$. The higher gate signal on transistor $Q_2$ will cause the source-to-drain current of transistor $Q_2$ to decrease or in effect raise the resistance in the source circuit of transistor $Q_1$ to return the current supplied to capacitor $C_s$ to its former value.

In addition, where there are differences in mobility on threshold voltages from chip-to-chip in a production run, the arrangement compensates for these variations in the following manner. Assume a first chip has a nominal threshold voltage associated therewith and a second chip has a higher threshold voltage associated with it. The first chip generates a first ramp voltage which may be termed the nominal output signal.

On the second chip, due to the higher threshold voltage, the current through transistor $Q_1$ set up by the biasing on the gate of transistor $Q_1$ will be lower than the corresponding current in transistor $Q_1$ of the first chip. The result is a lower ramp on the second chip output terminal which results in a lower d.c. level to the gate of transistor $Q_2$, which in turn causes a lower equivalent resistance represented by transistor $Q_2$ and hence a higher current is passed through the main electrodes of the cascoded combination of transistors $Q_1$ and $Q_2$, thereby tending to generate a higher ramp slope at the output terminal.

The ramp output signal will not be identical from the first chip to the second chip, but the difference is significantly less than the percentage difference of threshold voltages (or mobility) from the first chip to the second chip. This means that a great number of chips having threshold voltages or mobility factors which vary from a nominal value will still be useable for the application, whereas, in the prior art they would be unsuitable.

What is claimed is:

1. A circuit comprising:

a first and a second insulated gate field effect transistor each having two main electrodes and a control electrode, one main electrode of the first transistor being electrically connected to one main electrode of the second transistor;

means coupled to the control electrode of the first transistor for biasing the first transistor in the saturated region of operation;

means coupled to the control electrode and to the other main electrode of the second transistor, including a connection from the other main electrode of said first transistor to the control electrode of said second transistor, for biasing the second transistor in the linear region of operation with the resistance of the second transistor being controllable from said other main electrode of the first transistor.

2. The circuit according to claim 1 wherein said circuit is integrated on a single chip of semiconductive material and said first and second transistors are P channel MOS devices.

3. The circuit according to claim 1 further comprising:

a capacitance means connected between the other main electrode of the first transistor and a point of reference potential; and switching means connected in shunt across said capacitance means, said switching means being periodically closed, whereby a ramp waveform is generated at the other main electrode of said first transistor.

4. The circuit according to claim 3 wherein said means for connecting the other main electrode of the first transistor to the control electrode of the second transistor comprises means for amplifying and means for filtering a signal appearing at the other main electrode of the first transistor.

5. The circuit according to claim 4 wherein said switching means comprises an N channel MOS device and said first and second transistors comprise P channel MOS devices, said switching means and said first and second transistors being integrated on the same semiconductor chip and further wherein said capacitance means is a discrete element external to said chip.

6. A ramp generator circuit comprising:

first and second P channel MOS field effect transistors each having two main electrodes and a control electrode, one main electrode of the first transistor being electrically connected to one main electrode of the second transistor;

biasing means connected to the control electrode of the first transistor for providing a biasing voltage having an amplitude of substantially twice the threshold voltage of said first transistor whereby said first transistor is operated in the saturated region;

means coupled to the control electrode and to the other main electrode of said second transistor, including a connection from the other main electrode of said first transistor to the control electrode of said second transistor, for biasing the second transistor in the linear resistance region of operation with the resistance of the second transistor being controllable from said other main electrode of the first transistor;

energy storage means connected between said other main electrode of the first transistor and a point of reference potential;

a N channel MOS field effect transistor having a control electrode and two main electrodes, one main electrode of said N channel transistor being connected to said other main electrode of the first transistor, the other main electrode of said N channel transistor being connected to said point of reference potential;

means for applying a periodic switching signal to the control electrode of said N channel transistor, a periodic ramp waveform thereby appearing at the other main electrode of said first P channel transistor; and output circuit means connected to the other main electrode of the first transistor.

* * * * *